US010396717B2

(12) United States Patent
Liu

(10) Patent No.: US 10,396,717 B2
(45) Date of Patent: Aug. 27, 2019

(54) POWER CONTROL METHOD, DEVICE AND COMMUNICATION TERMINAL FOR RADIO FREQUENCY POWER AMPLIFIER

(71) Applicant: Beijing Vanchip Technologies Co., Ltd., Beijing (CN)

(72) Inventor: Xida Liu, Beijing (CN)

(73) Assignee: BEIJING VANCHIP TECHNOLOGIES CO., LTD., Beijing (CN)

( * ) Notice: Subject to any disclaimer, the term of this patent is extended or adjusted under 35 U.S.C. 154(b) by 0 days.

(21) Appl. No.: 15/528,283

(22) PCT Filed: Nov. 20, 2015

(86) PCT No.: PCT/CN2015/095222
§ 371 (c)(1),
(2) Date: May 19, 2017

(87) PCT Pub. No.: WO2016/078618
PCT Pub. Date: May 26, 2016

(65) Prior Publication Data
US 2017/0373643 A1 Dec. 28, 2017

(30) Foreign Application Priority Data

Nov. 20, 2014 (CN) .......................... 2014 1 0667568
Nov. 20, 2014 (CN) ..................... 2014 2 0702487 U

(51) Int. Cl.
*H03G 3/10* (2006.01)
*H03F 1/02* (2006.01)
(Continued)

(52) U.S. Cl.
CPC ........... *H03F 1/0227* (2013.01); *G05F 1/468* (2013.01); *G05F 1/56* (2013.01); *H03F 1/025* (2013.01);
(Continued)

(58) Field of Classification Search
CPC . H03F 3/21; H03F 1/0227; H03F 1/22; H03F 1/32; H03F 1/56; H03F 3/19;
(Continued)

(56) References Cited

U.S. PATENT DOCUMENTS 7,106,033 B1 * 9/2006 Liu .......................... G05F 1/575
323/280
2005/0140457 A1 6/2005 Bellantoni

FOREIGN PATENT DOCUMENTS

CN 102111112 6/2011
CN 102983823 3/2013
(Continued)

*Primary Examiner* — Khanh V Nguyen
*Assistant Examiner* — Khiem D Nguyen
(74) *Attorney, Agent, or Firm* — Emerson, Thomson & Bennett, LLC; Roger D. Emerson

(57) ABSTRACT

Disclosed is a power control method for a radio frequency power amplifier, comprising the following steps: S1. reading a power source voltage signal and a power control signal and generating an amplified signal having a linear relationship with the power control signal; S2. according to the amplified signal and saturation information, generating one or more controlled currents, merging each controlled current, and converting the merged total current into voltage; S3. Conducting linear voltage regulation on the converted voltage and generating a base control voltage of the radio frequency power amplifier. The present invention dynamically monitors the saturation information of a pass element to change the base voltage of the radio frequency power amplifier, thus improving additional power efficiency of the radio frequency power amplifier at multiple power level and over a large power source voltage range, and improving the properties of the radio frequency switch thereof.

12 Claims, 4 Drawing Sheets

(51) Int. Cl.
  *G05F 1/46*    (2006.01)
  *G05F 1/56*    (2006.01)
  *H03G 3/30*    (2006.01)

(52) U.S. Cl.
  CPC ......... *H03F 1/0216* (2013.01); *H03F 1/0277* (2013.01); *H03G 3/3047* (2013.01); *H03F 2200/555* (2013.01)

(58) Field of Classification Search
  CPC ........ H03F 3/191; H03F 3/245; H03F 1/0211; H04B 1/0475
  USPC ................. 330/285, 279, 296–297, 127, 129
  See application file for complete search history.

(56)         References Cited

FOREIGN PATENT DOCUMENTS

| CN | 103138690 | 6/2013 |
| CN | 203457108 | 2/2014 |
| CN | 104617885 | 5/2015 |
| CN | 204465462 | 7/2015 |

\* cited by examiner

POWER CONTROL METHOD, DEVICE AND COMMUNICATION TERMINAL FOR RADIO FREQUENCY POWER AMPLIFIER

BACKGROUND

Technical Field

The present invention relates to the field of wireless communications technologies, to a power control method for a radio frequency power amplifier (RF PA), and also to a power control device for implementing the power control method and a communication terminal including the power control device.

Related Art

An RF PA is widely applied to communication terminals such as mobile phones. In a pre-stage circuit of a transmitter, a power of a radio frequency signal generated by a modulation and oscillation circuit is very low, and an RF PA needs to perform a series of amplifications in a buffer stage, an intermediate amplification stage, and a final power amplification stage to obtain a sufficient radio frequency power, so as to feed the power to the antenna to radiate it. In this process, accurate power control is critical to ensuring normal use of a communication terminal.

At present, there are various mobile communications standards or wireless communications standards, such as GSM, TD-LTE, WCDMA, and Wi-Fi, in the market. Accurate power control within a broad dynamic range is required in all of the communications standards. Power levels of an RF PA may be classified into a low output power, a rated power, and a high output power. In the prior art, a design requirement for an RF PA is usually implementing maximization of power-added efficiency at a high output power (or a rated power). As a result, efficiency of the RF PA at a low power is very poor. Therefore, it is still a challenge to design an RF PA that can efficiently operate within respective power ranges.

In the prior art, a common solution is that a power control line provides two voltages. One is used for biasing a base of an RF PA in a high power output mode, and the other one is used in a low power output mode. Apparently, because the two voltages are separate rather than continuous, when switching is performed between the two voltages, a sudden change of an output power will occur, which may degrade a power spectrum characteristic and generate noise.

Another solution is that a power detector is added on an output end of a radio frequency power amplifier, so that information of an output power is sent to a power controller by using a feedback circuit in a voltage or current form, thereby controlling a voltage of a collector or a base, so as to optimize a control power. A challenge of the solution is to design a feedback circuit that is stable and has an enough bandwidth on each power level.

A third solution is that a power control device generates a voltage for biasing a base of an RF PA. The voltage is a linear combination of a power control signal and a reference voltage. Although by means of the solution, power-added efficiency at a low power is improved, a switch spectrum and a harmonic wave may easily deteriorate at a high power, especially at a high power and a low supply voltage.

It is well known that any power control solution needs to satisfy related communications standards. For example, output power control needs to satisfy a requirement of a burst mask. Rising and falling of a power control signal and a corresponding power level are clearly specified for the burst mask. Therefore, linearly controlling a base voltage by using a power control signal while satisfying a requirement of the burst mask, so as to further improve efficiency of an RF PA without affecting a switch spectrum characteristic, is a technical problem urgently needs to be resolved.

SUMMARY

For disadvantages of the prior art, a primary technical problem to be resolved by the present invention is to provide a power control method for an RF PA.

Another technical problem to be resolved by the present invention is to provide a power control device for implementing the power control method.

Still another problem to be resolved by the present invention is to provide a communication terminal including the power control device.

To achieve the foregoing objectives of the present invention, the following technical solutions are used in the present invention.

A power control method for an RF PA includes the following steps:

S1. reading a supply voltage signal and a power control signal, and generating an amplified signal having a linear relationship with the power control signal;

S2. generating one or more controlled currents according to the amplified signal and saturation degree information, combining the controlled currents, and converting a combined total current into a voltage; and S3. performing linear voltage regulation on the converted voltage, and generating a base control voltage of the RF PA.

Preferably, the saturation degree information is obtained by dynamically monitoring a pass element.

A power control device for an RF PA, used to implement the power control method, includes: a first linear regulator module, a voltage sensing module, and a second linear regulator module, where the voltage sensing module collects an output signal of the first linear regulator module, and transmits a result to the second linear regulator module after processing the output signal.

Preferably, the first linear regulator module includes a pass element 105, an error amplifier 102, and a feedback circuit 104, where the error amplifier 102 is an operational amplifier, an out-phase input end is connected to an externally provided power control signal Vramp, an in-phase input end is connected to one end of the feedback circuit 104, and an output end 103 is connected to a gate of the pass element 105; and a source of the pass element 105 is connected to a power supply end, a drain 106 is connected to the other end of the feedback circuit 104, and is also connected to a base of each RF PA.

Preferably, the pass element 105 is a PMOS transistor.

Preferably, the voltage sensing module 201 includes a multi-end voltage divider 203, controlled current sources (210 and 213), and a current-to-voltage converter 211, where an input end 202 of the multi-end voltage divider is connected to the gate of the pass element 105 of the first linear regulator module, and output ends (205 and 207) are connected to voltage control ends of the controlled current sources; current input ends of the controlled current sources are connected to a drain of the pass element 105 of the first linear regulator module, and current output ends are connected to the current-to-voltage converter 211; and the current-to-voltage converter 211 converts currents from all of the controlled current sources into a voltage and output the voltage.

Preferably, the controlled current source includes a current mirror 2130 and a common-gate PMOS transistor 2133, where an input end 2131 of the current mirror 2130 is connected to a drain of the common-gate PMOS transistor 2133, and an output end 2132 of the current mirror 2130 is connected to the current-to-voltage converter 211; a gate of the common-gate PMOS transistor 2133 is a voltage control end Vc of the controlled current source, and is connected to an output end of the multi-end voltage divider; and a source of the common-gate PMOS transistor 2133 is connected to a drain of the pass element (105) of the first linear regulator module.

Preferably, when the power control signal Vramp is relatively small, voltages on the output ends of the multi-end voltage divider are all relatively high, and the controlled current sources are in an off state; and when the power control signal Vramp gradually increases, the controlled current sources are sequentially turned on according to an ascending order of the voltages on the output ends of the multi-end voltage divider.

Preferably, the multi-end voltage divider 203 is constituted by multiple resistors connected in series, and voltages extracted from connection points are connected to the voltage control ends of the controlled current sources.

Preferably, the multi-end voltage divider 203 includes one or more MOS transistors, and gates of the MOS transistors are connected to the voltage control ends of the controlled current sources, where when there is one MOS transistor, a source of the MOS transistor is connected to the gate of the pass element 105, and a drain is connected to the current source; or when there are multiple MOS transistors, a source of one of the MOS transistors is connected to the gate of the pass element 105, a drain is connected to a source of another MOS transistor, a drain of the another MOS transistor is further connected to a source of any one of the other MOS transistors, and so on, and a drain of a last MOS transistor is connected to the current source.

Preferably, the current-to-voltage converter 211 includes a current mirror and a current source; sources of two MOS transistors in the current mirror are connected to each other and are connected to one end of the current source, where a drain of one MOS transistor is connected to a current output end of the current source, and a drain of the other MOS transistor is connected to another end of the current source in parallel and is connected to a resistor.

Preferably, the second linear regulator module 301 includes an error amplifier 303, a feedback circuit 305, and a pass element 304, where the error amplifier 303 is an operational amplifier, an out-phase input end is connected to an input end 212 of the current-to-voltage converter 211, an in-phase input end is connected to one end of the feedback circuit 305, and an output end is connected to a gate of the pass element 304; and a source of the pass element 304 is connected to a power supply end, and a drain 307 is connected to the other end of the feedback circuit 305, and is also connected to a base of each RF PA.

A communication terminal having an RF PA includes any one of the foregoing power control devices.

As compared with the prior art, the present invention may optimize power-added efficiency of an RF PA at multiple power levels and within a broad supply voltage range, so that a working current of the RF PA is reduced during in a status of low power output, thereby reducing system noise. A voltage sensing module is beneficial to improving a transient switch spectrum characteristic of the RF PA and improving the working efficiency at a rated power.

DETAILED DESCRIPTION

The following further describes technical content of the present invention in details with reference to the accompanying drawings and specific embodiments.

To achieve an objective of optimizing power-added efficiency of an RF PA at multiple power levels and within a broad supply voltage range, the present invention first provides a power control method for an RF PA. The method mainly includes the following steps:

1. reading a supply voltage signal and a power control signal, and generating an amplified signal having a linear relationship with the power control signal;

2. generating one or more controlled currents according to the amplified signal and saturation degree information, combining the controlled currents, and converting a combined total current into a voltage; and 3. performing linear voltage regulation on the converted voltage, and generating a base control voltage of the RF PA.

Technical details about the power control method are described in detail together with the following power control device.

The present invention further provides a power control device for an RF PA. The power control device includes: a first linear regulator module, used to read a supply voltage signal and a power control signal, and generate an amplified signal having a linear relationship with the power control signal; a voltage sensing module, used to generate a varying controllable current according to the amplified signal and saturation degree information of a pass element in the first linear regulator module, and convert the controllable current into a voltage; and a second linear regulator module, used to perform linear voltage regulation on the converted voltage and generate a base control voltage of the RF PA. The first linear regulator module is connected to the voltage sensing module, and the voltage sensing module is connected to the second linear regulator module.

Figure 1:
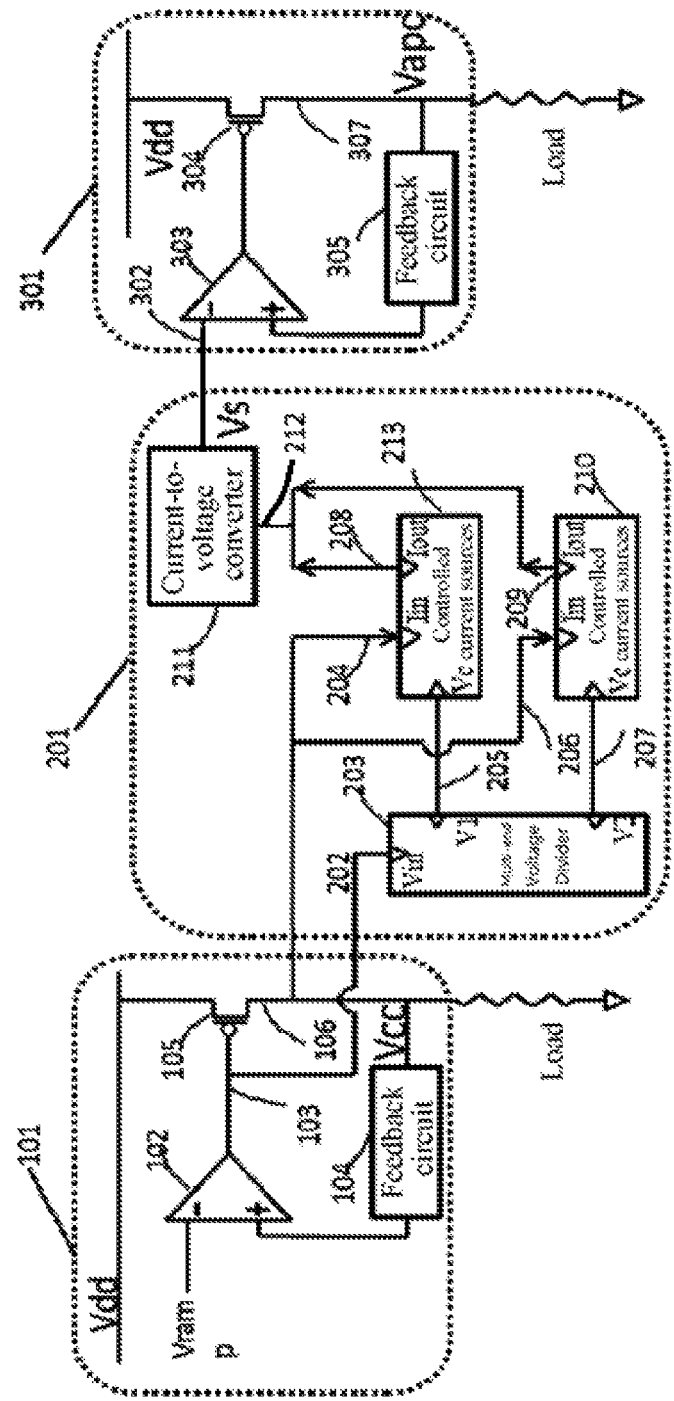
FIG. 1 is an exemplary diagram of a topology structure of a power control device according to the present invention.

The following describes the specific technical solution of the foregoing power control device in detail. FIG. 1 shows an example of a power control device for an RF PA according to the present invention. The power control device includes a first linear regulator module 101, a voltage sensing module 201, and a second linear regulator module 301. The voltage sensing module 201 is coupled to the first linear regulator module 101 by using two input ends, and the second linear regulator module 301 is coupled to the voltage sensing module.

The second linear regulator module 301 includes an error amplifier 102, a feedback circuit 104, and a pass element 105. The error amplifier 102 is an operational amplifier, an out-phase input end is connected to an externally provided power control signal Vramp, an in-phase input end is connected to one end of the feedback circuit 104, and an output end 103 is connected to a gate of the pass element 105. A source of the pass element 105 is connected to a power supply source (a voltage herein is Vdd), a drain 106 is connected to another end of the feedback circuit, and is also connected to bases of one or more RF PAs, which are represented by loads in FIG. 1. The first linear regulator module 101 has two output ends. One of the output ends is the drain 106 of the pass element 105, and a voltage herein is Vcc. The other output end is the output end of the error amplifier 103 (also as the gate of the pass element 105). Due to a negative feedback characteristic of the first linear regulator module 101, the voltage Vcc on the drain 106 of the pass element 105 responds to the power control signal Vramp.

Figure 2:
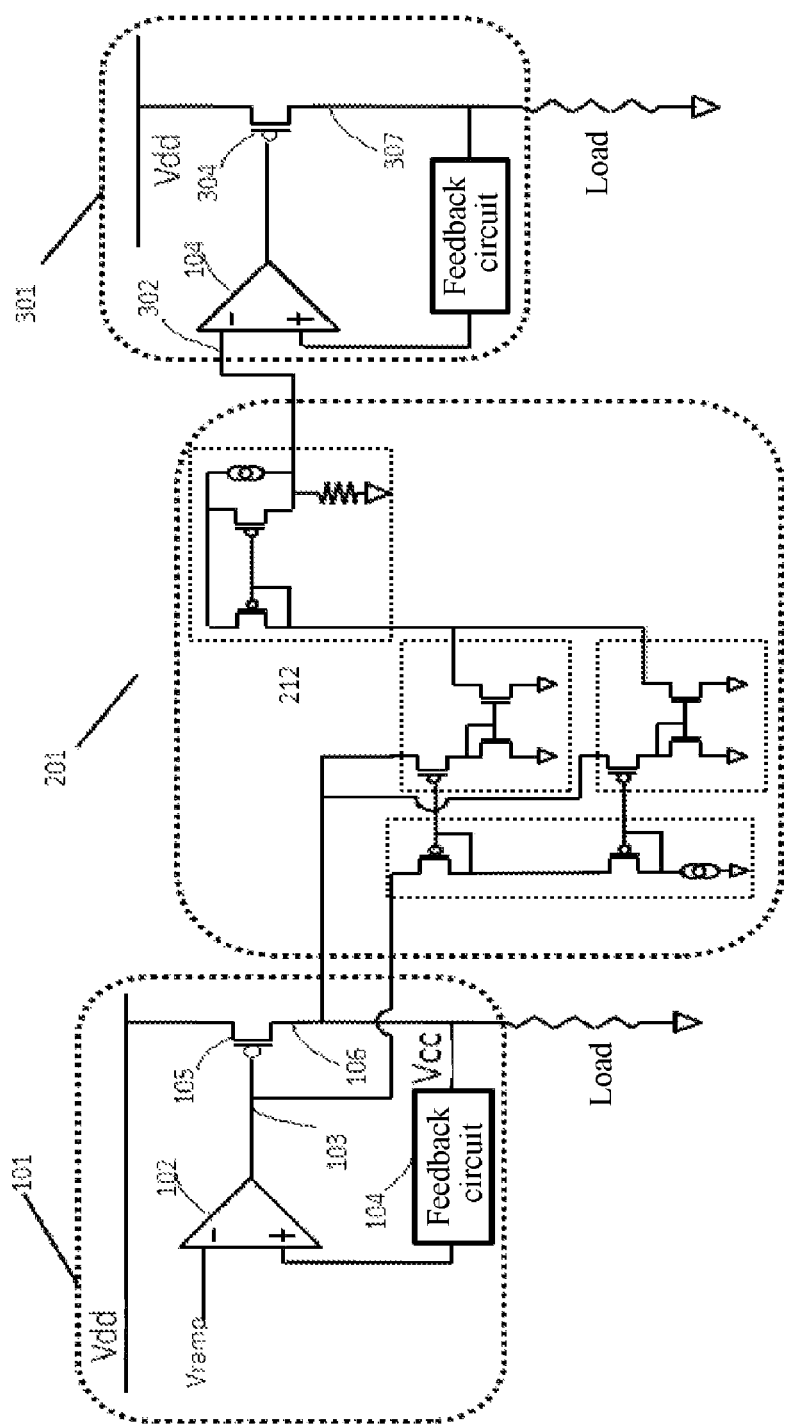
FIG. 2 is a schematic circuit diagram of a power control device shown in FIG. 1.

The output signal Vcc of the first linear regulator module 101 linearly responds to the power control signal Vramp, and controls the bases of the RF PAs, which are represented by loads in FIG. 1 and FIG. 2. An output signal Vapc of the second linear regulator module 301 non-linearly responds to the power control signal Vramp, is a multi-stage increasing function of the power control signal Vramp, and controls the bases of the RF PAs.

It is generally known that the PMOS transistor that serves as the pass element usually has two operating states: a linear operating region and a saturated operating region. When the power control signal is relatively small, the PMOS transistor is in the saturated operating region. In this case, the entire first linear regulator module 101 has a relatively broad operating bandwidth, and has a strong voltage regulation function. When the power control signal Vramp is increased, the PMOS transistor gradually departs from the saturated operating region to enter a linear region. In this case, a bandwidth of a system is narrowed, and the voltage regulation function is weakened. The PMOS being in which operating state may be determined by a relative value of a voltage at each port of the PMOS transistor. Specifically, if $$Vsg < Vsd + |Vtp| \quad (1),$$

where Vsg is a voltage difference between the source and the gate, Vsd is a voltage difference between the source and the drain, Vtp is a threshold voltage of the PMOS transistor, and the PMOS transistor is in the saturated region. Otherwise, the PMOS transistor is in the linear region. When the power control signal herein is very strong, Vsg is far greater than Vsd+|Vtp|, the PMOS transistor is in a deep linear region, and a saturation degree of the PMOS transistor is very small.

Because the saturation degree of the pass element 105 (that is, the PMOS transistor) in the first linear regulator module 101 is very critical to performance of the entire power control device, a voltage sensing module 201 is introduced in the present invention to measure the saturation degree of the pass element 105 in real time.

The voltage sensing module includes a multi-end voltage divider, one or more controlled current sources, and a current-to-voltage converter. The module has two input signals and one output signal. Voltages on the output ends of the first linear regulator module 101, that is, the drain 106 and the gate 103 of the pass element 105, are two input signals of the voltage sensing module, and an output voltage signal Vs is generated on the current-to-voltage converter.

The multi-end voltage divider includes one or more MOS transistors connected in series, and gates of the MOS transistors are connected to voltage control ends of the controlled current sources. When there is one MOS transistor, a source of the MOS transistor is connected to the gate of the pass element 105, and a drain is connected to the current source. When there are multiple MOS transistors, a source of a first MOS transistor is connected to the gate of the pass element 105, a drain is connected to a source of another MOS transistor, a drain of another MOS transistor is connected to a source of a next MOS transistor, and so on, and a drain of a last MOS transistor is connected to the current sources. Of course, the multi-end voltage divider 203 may include multiple resistors connected in series, and voltages extracted from connection points are connected to the voltage control ends of the controlled current sources.

The controlled current source includes a current mirror 2130 and a common-gate PMOS transistor 2133. An input end 2131 of the current mirror 2130 is connected to a drain of the common-gate PMOS transistor 2133, and an output end 2132 of the current mirror 2130 is connected to the current-to-voltage converter 211. A gate of the common-gate PMOS transistor 2133 is a voltage control end Vc of the controlled current source, and is connected to an output end of the multi-end voltage divider. A source of the common-gate PMOS transistor 2133 is connected to a drain of the pass element 105 of the first linear regulator module.

The current-to-voltage converter 211 includes a current mirror and a constant current source. Sources of two MOS transistors in the current mirror are connected to each other, and are connected to a voltage source. A drain of one of the MOS transistors is connected to the current output end of the controlled current source, and a drain of the other MOS transistor is connected to another end of the current source in parallel and is connected to a resistor.

The output signal Vs of the voltage sensing module 201 is connected to an input end of the second linear regulator module 301, and finally, a voltage signal is generated on an output end of the linear voltage regulation system and is used to control bases of the RF PAs. The second linear regulator module 301 includes an error amplifier 303, a feedback circuit 305, and a pass element 304. The error amplifier 303 is an operational amplifier. An out-phase input end is connected to an output end 212 of the current-to-voltage converter 211, an in-phase input end is connected to one end of the feedback circuit 305, and an output end is connected to a gate of the pass element 304. A source of the pass element 304 is connected to a power supply end, and a drain 307 is connected to another end of the feedback circuit, and is also connected to the bases of the one or more RF PAs. The drain 307 provides a base voltage Vapc for the RF PAs.

As shown in FIG. 1 and FIG. 2, in an embodiment of the present invention, the voltage sensing module 201 uses two controlled current sources 210 and 213. Either of the controlled current sources has an input end Iin, a current output end Iout, and a voltage control end Vc. The multi-end voltage divider 203 has an input end 202 and two output ends 205 and 207, and is intended to divide a gate voltage of the pass element 105 into voltages that progressively decrease in sequence. The input end 202 of the multi-end voltage divider 203 is connected to the output end 103 of the error amplifier 102 of the first linear regulator module 101, the output end 205 is connected to the voltage control end Vc of the controlled current source 213, and the output end 207 is connected to the voltage control end Vc of the controlled current source 210. If a voltage of the voltage control end of the controlled current source is lower, a greater current is generated. A current input end 206 of the controlled current source 210 and a current input end 204 of the controlled current source 213 are both connected to the gate 106 of the pass element 105 of the first linear regulator module 101, and a current output end 209 of the controlled current source 210 and a current output end 208 of the controlled current source 213 are combined and then are connected to an input end 212 of the current-to-voltage converter 211. The current-to-voltage converter 211 converts currents from all of the controlled current sources into a voltage Vs, that is, an output voltage of the voltage sensing module 201. If the currents generated by the controlled current sources are greater, an output voltage signal Vs of the current-to-voltage converter is stronger.

The multi-end voltage divider in the voltage sensing module performs voltage division on the gate voltage of the pass element 105 in the first linear regulator module 101, to generate one or more voltages that progressively decrease in sequence. The voltages are respectively connected to control ends of corresponding controlled current sources, that is, controlled voltages sequentially control the controlled current sources to operate, where currents generated by all of the controlled current sources are combined, and finally decide a value of a current entering the current-to-voltage converter. The current-to-voltage converter includes a current mirror and a constant current source. The current source is used to generate a constant current, and is used as a basic operating power supply. The current mirror performs mirroring on currents output from one or more controlled current sources. The foregoing two currents are grounded after passing through a resistor to generate a voltage, so as to complete a process of converting the currents to the voltage. Sources of two MOS transistors in the current mirror are connected to each other, and are connected to one end of a voltage source Vdd. A drain of one MOS transistor is connected to current output ends of the controlled current sources. A drain of the other MOS transistor is connected to the other end of the constant current source in parallel and is connected to the resistor, and a voltage is extracted from a connection point to serve as an input voltage of a next stage.

In the above, values of the controlled voltages of the controlled current sources have two statuses:

(1) When the power control signal Vramp increases, but the voltage source Vdd remains unchanged, an output voltage of the error amplifier 102 that is determined according to the power control signal Vramp decreases. Consequently, the gate voltage of the pass element 105 decreases. An output voltage Vcc of the drain 106 of the pass element 105 increases correspondingly, and a current flowing through the pass element 105 also increases. Divided voltages of the multi-end voltage divider 203 also decrease correspondingly, and therefore, the controlled voltages of the controlled current sources also increase correspondingly.

(2) When the power control signal Vramp remains unchanged, but the supply voltage Vdd decreases, to maintain the output voltage Vcc determined according to the power control signal Vramp unchanged, that is, the current flowing through the pass element 105 is unchanged, the gate voltage of the pass element 105 decreases correspondingly. The divided voltages of the multi-end voltage divider also decrease correspondingly, and therefore, the controlled voltages of the controlled current sources also decrease correspondingly.

Based on the above, the controlled current sources in the voltage sensing module 201 according to this embodiment of the present invention have the following features: as the power control signal Vramp becomes stronger or the supply voltage becomes lower, the controlled voltages become lower, and a generated current becomes stronger.

Figure 3:
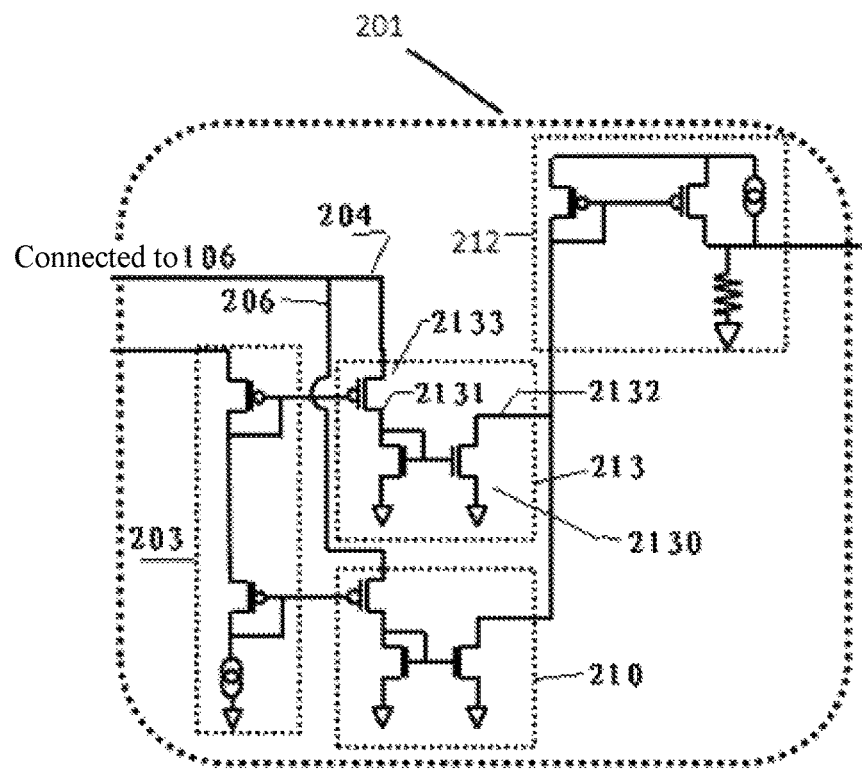
FIG. 3 is a schematic structural diagram of a topology structure of a voltage sensing module in the present invention.

As shown in FIG. 3, in an embodiment of the present invention, a controlled current source 213 is constituted by an improved current mirror. An input end 2131 of the current mirror 2130 is provided with a source current, and an output end 2132 is provided with another mirror current. A common-gate PMOS transistor 2133 is added on a path of the source current input end 2131, and a gate of the common-gate PMOS transistor 2133 is a voltage control end Vc of the controlled current source 213. The source of the common-gate PMOS transistor 2133 serves as another input end 204 of a voltage sensing module 201, and is connected to a drain 106 of a pass element 105 in a first linear regulator module 101. Due to the PMOS transistor, if the control voltage of the gate is lower, a generated current is greater. Because a controlled current source 210 is the same as the controlled current source 213, details are not described again.

According to this embodiment of the present invention, the voltage sensing module 201 may include one or more controlled current sources. When the voltage sensing module 201 includes at least two controlled current sources, a connection between them is similar to a series connection. All the current input ends are connected together, and all the current output ends are connected together. However, voltage control ends are respectively connected to divided voltage outputs of the voltage divider (V1 and V2 in FIG. 1). A sum of output currents of the controlled current sources in this embodiment is $$I=I1(Vcc-V2)+I2(Vcc-V2) \qquad (2),$$ where I1(Vcc–V1) is a current generated by a first controlled current source, and I2 (Vc–V2) is a current generated by a second controlled current source.

As the power control signal Vramp increases, the voltages V1 and V2 of the output ends of the multi-end voltage divider decrease, and the currents I1 and I2 of the controlled current source increase. The currents I1 and I2 have a same or similar expression (a difference is a coefficient), but a difference {(Vcc–V1)–(Vcc–V2)} between independent variables of the currents is exactly equal to a difference (V2–V1) between the controlled voltages. Therefore, the current I1 may be considered as a version of the current I2 having a delay on the voltage.

Figure 4:
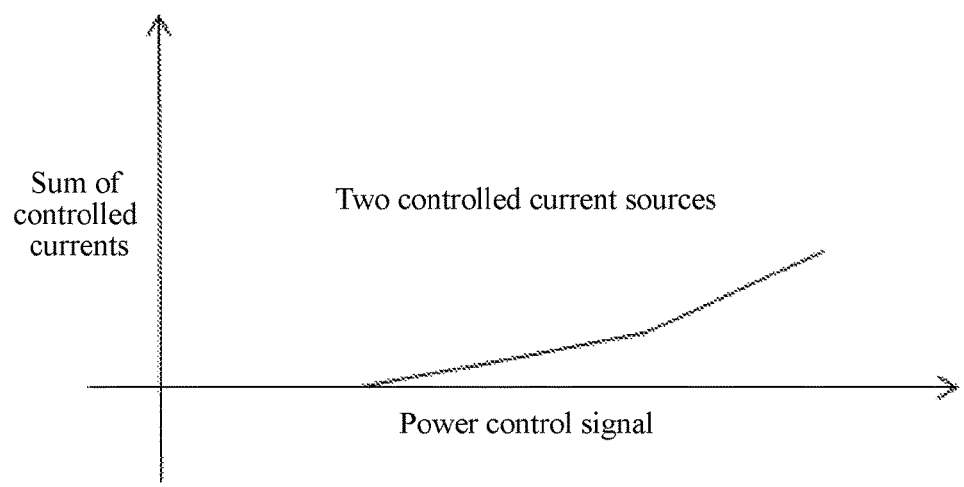
FIG. 4 is a schematic diagram of a relationship between a total current of a controlled current and a power control signal in the present invention.
Figure 5:
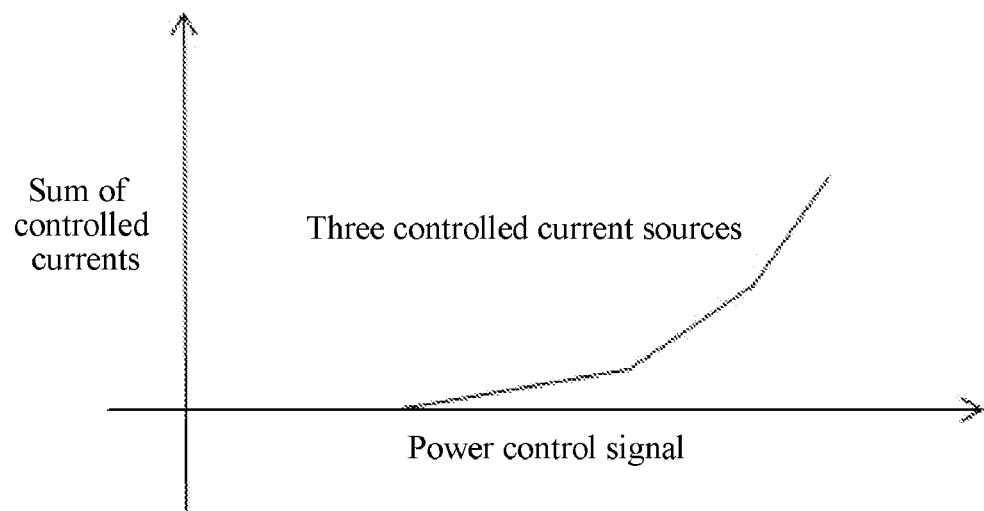
FIG. 5 is a schematic diagram of a relationship between a total current of another controlled current and a power control signal in the present invention.

When the power control signal Vramp is relatively weak, the voltages V1 and V2 of the output ends of the multi-end voltage divider are relatively high, and all of the controlled current sources are still in an off state. When the power control signal Vramp gradually increases, the second controlled current source and the first controlled current source (that is, the controlled current sources 210 and 213) are turned on successively. When the currents I1 and I2 are summed, a characteristic of two-stage function shown in FIG. 4 will appear. When there are three controlled current sources in the circuit, a characteristic of a three-stage function will appear, as shown in FIG. 5, and so on. N (N is a positive integer) controlled current sources may be disposed according to a requirement of an actual circuit. An inflexion point of each function may be precisely adjusted by adjusting a quantity of the controlled current sources and parameters of each controlled current source, thereby achieving power control and efficiency optimization while satisfying a burst mask condition, so as to achieve optimal power-added efficiency on each power level.

Therefore, in the voltage sensing module 201 according to this embodiment of the present invention, when the controlled current sources are in the foregoing two statuses (that is, the power control signal increases or the supply voltage decreases), the controlled voltages of the controlled current sources all decrease, directly resulting in an increase of the controlled currents. Consequently, the output voltage increases, and finally a base voltage of the RF PA increases.

It may be concluded from this that, a final output voltage Vapc in the present invention, that is, the base voltage of the RF PA, is neither one fixed voltage or two separate voltages in the previous technical solutions, nor a simple linear function of a control signal. The output voltage Vapc includes multiple items of information, such as a control signal, a supply voltage, and a saturation degree, of the pass element 105 in the first linear regulator module 101, can effectively improve power-added efficiency of the RF PA on each power level, and can better satisfy a requirement of the burst mask.

The power control device shown in the foregoing embodiments may be used in a chip. A specific structure of the power control device in the chip is not further described in detail herein.

In addition, the power control device may be used in a communication terminal as an important part of a radio frequency circuit. The communication terminal refers to a computer device that may be used in a mobile environment, that supports multiple communications standards such as GSM, EDGE, TD_SCDMA, TDD_LTE, and FDD_LTE, and that includes, but is not limited to, a mobile phone, a notebook computer, a tablet computer, an in-vehicle computer, and the like. In addition, the power control method and the power control device are also applicable to another application scenario of the RF PA is used, for example, a communications base station that is compatible with multiple communications standards.

Based on the above, the power control device provided in the present invention changes a base voltage of an RF PA by dynamically monitoring saturation degree information of a pass element, thereby improving power-added efficiency of an RF PA on multiple power levels and within a broad supply voltage range, and improving a radio frequency switch spectrum characteristic of the RF PA. According to the technical solutions provided in the present invention, a working current of the RF PA at a low power may be lowered, so as to reduce system noise.

The foregoing describes the power control method and device for an RF PA, and the communication terminal provided in the present invention in details. For persons of ordinary skill in the art, any obvious modification made to the present invention without departing from the essence and spirit of the present invention will constitute infringement on a patent right of the present invention, and corresponding legal liabilities should be borne.

What is claimed is:

1. A power control device, comprising: a first linear regulator module, a voltage sensing module, and a second linear regulator module, wherein
the first linear regulator module, used to read a supply voltage signal and a power control signal, and generate an amplified signal having a linear relationship with the power control signal;
the voltage sensing module, used to generate a controllable current according to the amplified signal and saturation degree information of a pass element in the first linear regulator module, and convert the controllable current into a voltage; and
the second linear regulator module, used to perform linear voltage regulation on the voltage and generate a base control voltage.

2. The power control device according to claim 1, wherein the first linear regulator module comprises a pass element (105), an error amplifier (102), and a feedback circuit (104), wherein
the error amplifier (102) is an operational amplifier, an out-phase input end is connected to an externally provided power control signal (Vramp), an in-phase input end is connected to one end of the feedback circuit (104), and an output end (103) is connected to a gate of the pass element (105); and
a source of the pass element (105) is connected to a power supply end, and a drain (106) is connected to the other end of the feedback circuit (104).

3. The power control device according to claim 2, wherein the pass element (105) is a PMOS transistor.

4. The power control device according to claim 1, wherein the voltage sensing module (201) comprises a multi-end voltage divider (203), one or more controlled current sources, and a current-to-voltage converter (211), wherein
an input end of the multi-end voltage divider is connected to the gate of the pass element (105) of the first linear regulator module, and each output end is separately connected to a voltage control end of each of the controlled current sources;
current input ends of the controlled current sources are connected to a drain of the pass element (105) of the first linear regulator module, and current output ends are connected to the current-to-voltage converter (211); and
the current-to-voltage converter (211) converts currents from all of the controlled current sources into a voltage and output the voltage.

5. The power control device according to claim 4, wherein any one of the controlled current sources comprises a current mirror (2130) and a common-gate PMOS transistor (2133), wherein an input end (2131) of the current mirror (2130) is connected to a drain of the common-gate PMOS transistor (2133), and an output end (2132) of the current mirror (2130) is connected to the current-to-voltage converter (211); a gate of the common-gate PMOS transistor (2133) is a voltage control end (Vc) of the controlled current source, and is connected to an output end of the multi-end voltage divider; and a source of the common-gate PMOS transistor (2133) is connected to a drain of the pass element (105) of the first linear regulator module.

6. The power control device according to claim 5, wherein when the power control signal (Vramp) is relatively small, voltages on the output ends of the multi-end voltage divider are relatively high, and the controlled current sources are in an off state; and when the power control signal (Vramp) gradually increases, the controlled current sources are sequentially turned on according to an ascending order of the voltages on the output ends of the multi-end voltage divider.

7. The power control device according to claim 4, wherein the multi-end voltage divider (203) is constituted by multiple resistors connected in series, and voltages extracted from connection points are connected to the voltage control ends of the controlled current sources.

8. The power control device according to claim 4, wherein the multi-end voltage divider (203) is constituted by a MOS transistor, wherein a gate of the MOS transistor is connected to the voltage control ends of the controlled current sources, a source is connected to a gate of the pass element (105), and a drain is connected to the current source.

9. The power control device according to claim 4, wherein the multi-end voltage divider (203) is constituted by multiple MOS transistors, and gates of the MOS transistors are connected to the voltage control ends of the controlled current sources, wherein a source of a first MOS transistor is connected to the gate of the pass element (105), a drain of the first MOS transistor is connected to a source of another MOS transistor, a drain of the another MOS transistor is connected to a source of a next MOS transistor, and so on, and a drain of a last MOS transistor is connected to the current source.

10. The power control device according to claim 4, wherein the current-to-voltage converter (211) comprises a current mirror and a constant current source; and sources of two MOS transistors in the current mirror are connected to each other and are connected to a voltage source, wherein a drain of one of the MOS transistors is connected to the output end of the controlled current source, and a drain of the other MOS transistor is connected to another end of the current source in parallel and is connected to a resistor.

11. The power control device according to claim 1, wherein the second linear regulator module (301) comprises an error amplifier (303), a feedback circuit (305), and a pass element (304), wherein the error amplifier (303) is an operational amplifier, an out-phase input end is connected to an input end (212) of the current-to-voltage converter (211), an in-phase input end is connected to one end of the feedback circuit (305), and an output end is connected to a gate of the pass element (304); and a source of the pass element (304) is connected to a power supply end, and a drain (307) is connected to the other end of the feedback circuit (305).

12. A communication terminal having a radio frequency power amplifier (RF PA), wherein the communication terminal comprises the power control device according to claim 1.

* * * * *